United States Patent
Blackburn et al.

(10) Patent No.: US 6,418,303 B1
(45) Date of Patent: Jul. 9, 2002

(54) FAST ATTACK AUTOMATIC GAIN CONTROL (AGC) LOOP AND METHODOLOGY FOR NARROW BAND RECEIVERS

(75) Inventors: Dane E. Blackburn, Sunrise; Raul Salvi, Miami, both of FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/515,293

(22) Filed: Feb. 29, 2000

(51) Int. Cl.[7] .................................................. H04B 1/06
(52) U.S. Cl. ................................ 455/234.2; 455/245.1; 455/247.1
(58) Field of Search .......................... 455/234.1, 234.2, 455/235.1, 239.1, 240.1–247.1, 232.1, 249.1–251.1; 375/345; 330/278, 288

(56) References Cited

U.S. PATENT DOCUMENTS

| | | | |
|---|---|---|---|
| 4,653,117 A | 3/1987 | Heck | 455/209 |
| 5,079,526 A | 1/1992 | Heck | 332/127 |
| 5,363,065 A * | 11/1994 | Dufour | 331/17 |
| 5,483,691 A | 1/1996 | Heck et al. | 455/234.2 |
| 5,584,059 A | 12/1996 | Turney et al. | 455/126 |
| 5,617,473 A | 4/1997 | Wietecha et al. | 379/399 |
| 5,742,899 A * | 4/1998 | Blackburn et al. | 455/234.2 |
| 5,789,974 A | 8/1998 | Ferguson, Jr. et al. | 330/2 |
| 5,893,029 A | 4/1999 | Bastani | 455/324 |
| 6,006,079 A | 12/1999 | Jaffee et al. | 455/310 |
| 6,324,320 B1 * | 2/2000 | Graham et al. | 375/345 |
| 6,038,435 A * | 3/2000 | Zhang | 455/234.1 |

* cited by examiner

Primary Examiner—Vivian Chin
Assistant Examiner—Duc Nguyen
(74) Attorney, Agent, or Firm—Frank M. Scutch, III

(57) ABSTRACT

A fast attack Automatic Gain Control (AGC) loop (100) having the capability to selectably shape one or more decaying current sources (242, 260) contained within an off-channel feedback loop and an on-channel feedback loop of the AGC loop by sequentially and selectively switching out weighted transistors (Tr0, Tr1, Tr2, . . . , Tr10) of a plurality of weighted current mirrors (313, 379, 453, 519) at predetermined intervals (t0, t1, t2, . . . , t10).

22 Claims, 11 Drawing Sheets

FAST ATTACK AUTOMATIC GAIN CONTROL (AGC) LOOP AND METHODOLOGY FOR NARROW BAND RECEIVERS

FIELD OF THE INVENTION

This invention relates in general to radio receivers, and in particular to narrow band zero intermediate frequency (ZIF) receivers. Specifically, certain embodiments of this invention relate to narrow band ZIF receivers that employ automatic gain control (AGC).

BACKGROUND OF THE INVENTION

Narrow band ZIF receivers tend to have slow AGC loop settling times. This is due in part to the closed loop nature of AGC systems and the fact that narrow bandwidth filters tend to add lengthy phase delays near the filter corner frequencies, thereby placing stability limitations on the maximum loop bandwidth of an AGC loop. For narrow band ZIF receivers, AGC settling times in the 4–6 millisecond range are considered exceptionally short. Notwithstanding, there are several emerging applications where settling times under 2 milliseconds are required. AGC Loops wide enough to theoretically achieve the desired settling times are typically unstable or underdamped and therefore induce excessive ripple in the AGC loop gain control signal. An alternative solution suggests switching to a faster AGC loop during settling and then switching back to the slower loop during normal operation. Unfortunately, when a fast AGC loop is switched to a slower AGC loop, ripple in the gain control signal due to fast loop tracking of the amplitude modulated (AM) signal can leave the control signal at an arbitrarily high level. Additional settling time is required to recover from this overshoot condition. As will be appreciated by those of ordinary skill in the art, this additional settling time only operates to defeat the purpose of adapting the fast loop in the first instance. For these reasons, it would be extremely advantageous to provide an apparatus for acquiring a rapid AGC response (settling time) in a narrow band ZIF receiver.

DETAILED DESCRIPTION OF THE PREFERRED EMBODIMENT

Figure 1:
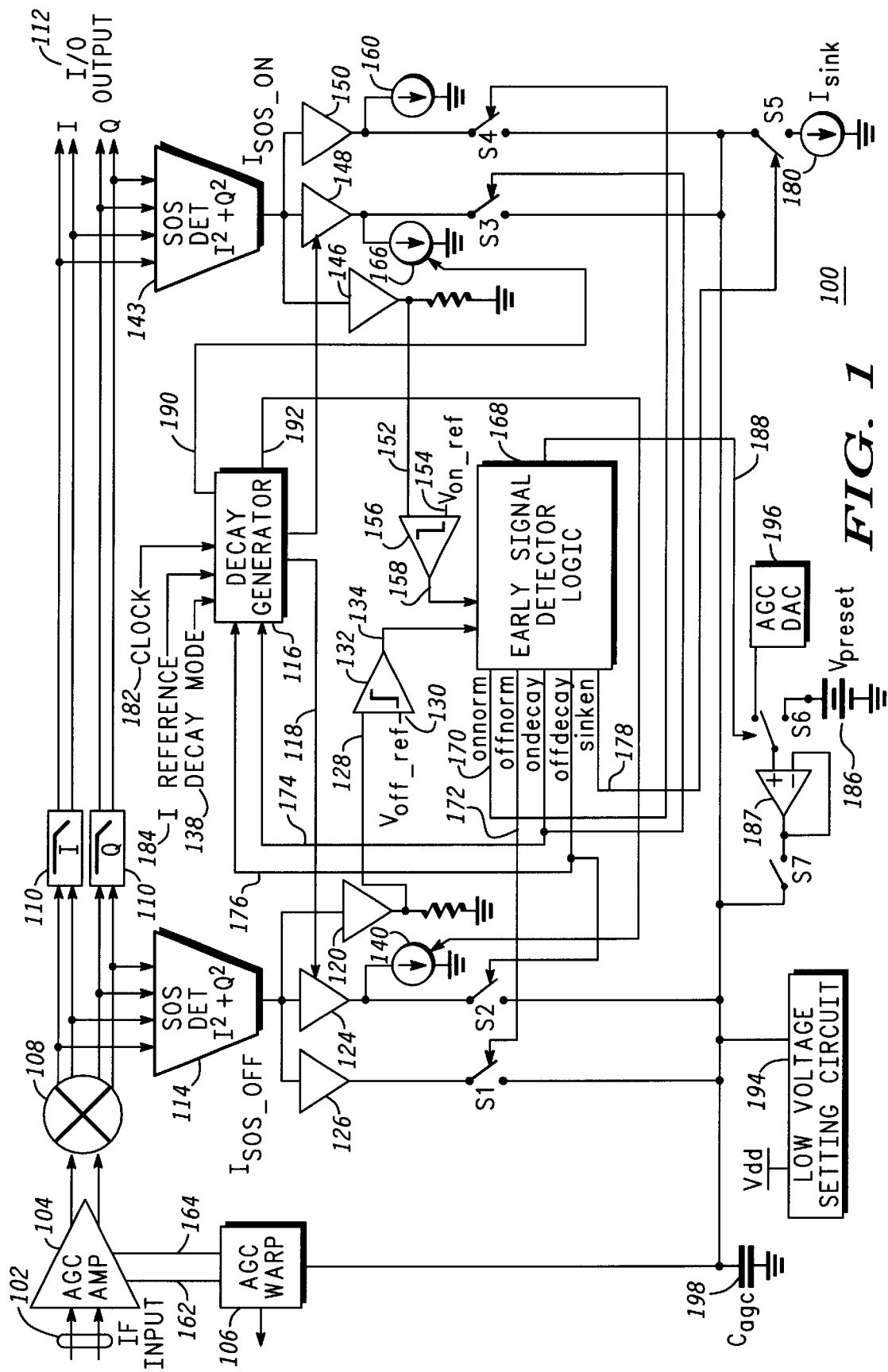
FIG. 1 is a block diagram of an AGC loop for use with a narrow band radio receiver, in accordance with the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawing.

Referring now to FIG. 1, a detailed block diagram of an Automatic Gain Control (AGC) loop for use with a narrow band radio receiver is shown. The AGC loop 100 includes a forward transmission path and two feedback loops coupled across the forward path. In the preferred embodiment, the forward transmission path has Automatic Gain Control (AGC) amplifier 104, Down Mixer 108, and Baseband Low Pass Filters (LPF) 110. The inputs to AGC loop 100 are Intermediate Frequency (IF) signals 102 and the outputs 112 are baseband quadrature signals 112. In each of the two feedback paths, three detector functions are found that correlate with three modes of operation of AGC loop 100 and are produced by the appropriate sum-of-squares (SOS) detector 114 or 143 in combination with an appropriate amplifier gain stage Gnorm, Gdecay, or Gesd; these modes of operation of AGC loop 100 include a normal mode of operation defined by an SOS detector in combination with the appropriate Gnorm amplifier gain stage, an early signal detect mode of operation defined by an SOS detector in combination with the appropriate Gesd amplifier gain stage, and a decay mode of operation defined by an SOS detector in combination with the appropriate Gdecay amplifier gain stage. Low Voltage Setting Circuit 194 operates to prevent the voltage on AGC integrating capacitor 198 going below a certain level. Early Signal Detect Logic controller 168 receives signals from Gesd amplifier gain stages 120 and 144 and operates to generate control signals that control switches S1–S4 and partially control operation of Decay Generator 116, as will be described.

In the first feedback path, a first detector function is provided at the Low Pass Filter 110 input by SOS detector 114 in combination with Gesd amplifier gain stage 120 and is used to detect a signal state condition in the forward transmission path; namely signal presence and/or absence. The second detector function of the first feedback path is provided by SOS detector 114 in combination with Gnorm amplifier gain stage 126 and is used to control the amplitude of off-channel and/or adjacent-channel (undesired) signals in the forward path. The third detector function of the first feedback path is provided by SOS detector 114 in combination with Gdecay amplifier gain stage 124 and is used to combat any overshoot condition, as described herein in more detail. In the second feedback path, a first detector function is provided at the Low Pass Filter 110 output by SOS detector 143 in combination with Gesd amplifier gain stage 144 and is used to detect a signal state condition in the forward path; namely signal presence and/or absence. The second detector function of the second feedback path is provided by SOS detector 143 in combination with Gnorm amplifier gain stage 150 and is used to control the amplitude of on-channel (desired) signals in the forward path. The third detector function of the second feedback path is provided by SOS detector 143 in combination with Gdecay amplifier gain stage 148 and is used to combat any overshoot condition, as described herein in more detail.

SOS detectors 114 and 143 work with amplifier gain stages 126 and 150, respectively, to provide an output current that is proportional to the sum of the squared quadrature input voltages. In operation, the threshold point for the off-channel detector formed by SOS detector 114 and Gnorm amplifier gain stage 126 is set large enough so that it will not react to the presence of on-channel signals. The on-channel detector formed by SOS detector 143 and Gnorm amplifier gain stage 150 detects signals at LPF 110 output and therefore does not react to off-channel signals since they are substantially attenuated by LPF 110. The output current of the on-channel detector formed by SOS detector 143 and Gnorm 150 and the off-channel detector formed by SOS detector 114 and Gnorm 126 are combined and fed to AGC integrating capacitor 198 which produces a gain control signal 162 applied to AGC amplifier 104 via AGC Warp 106 in order to control the gain of AGC amplifier stage 104. AGC Warp 106 should have a linear slope versus input power level, where the slope is defined as decibel (dB) of attenuation per amplifier volt change in gain control signal 162. The slope is expressed mathematically as dB/Volts.

As will be appreciated by those of ordinary skill in the art, after review hereof, this arrangement operates to produce a graduated degradation of on-channel signals as the level of off-channel signals increase. This is accomplished, in part, by defining the on-channel AGC threshold as the maximum desired on-channel voltage swing at the LPF 110 output. The off-channel AGC threshold is then defined as the maximum desired off-channel voltage swing at the LPF 110 input. At threshold, the net currents entering and exiting integrating capacitor 198 sum to zero, thus threshold is realized by balancing the currents into integrating capacitor 198. How this balance is achieved is explained below.

In accordance with the preferred embodiment, a current sink 160 is employed at the output of Gnorm 150. For the on-channel detector formed by SOS detector 143 and Gnorm 150, the current sink current magnitude is set such that when the input voltage of SOS detector 143 is at AGC threshold, the output current magnitude of Gnorm 150 equals the magnitude of the current sink. Conversely, if the on-channel input voltage to SOS detector 143 is lower than the AGC threshold voltage, the output current magnitude of Gnorm 150 will be less than the magnitude of the current sink 160 and the current from the SOS detector 154 and Gnorm 150 is a current sink. If, on the other hand, the on-channel input voltage to SOS detector 143 is larger than the AGC threshold voltage, the output current magnitude of Gnorm 150 will be greater than the magnitude of the current sink and the current from the detector formed by SOS detector 143 and Gnorm 150 will be a current source. The off-channel detector formed by SOS 114 and Gnorm 126 is set up so that it only sources current in the presence of strong off-channel signals. For weak off-channel signals, the net output current of the detector formed by SOS detector 114 and Gnorm 126 is zero.

When the composite SOS detector function formed by SOS detector 114/Gnorm 126 and by SOS detector 143/Gnorm 150 sinks current, gain control signal 162 amplitude decreases. A decrease in gain control signal 162 amplitude results in decreased attenuation to input 102 by AGC amplifier stage 104. Conversely, when the composite SOS detector function formed by SOS detector 114/Gnorm 126 and by SOS detector 143/Gnorm 150 sources current, gain control signal 162 amplitude increases. An increase in gain control signal 162 amplitude results in increased attenuation to input 102 by AGC amplifier stage 104. The composite SOS detector function described above is arranged such that for weak on-channel signals, the SOS detector function sinks current, decreases the amplitude of gain control signal 162, decreases attenuation by AGC amplifier stage 104 and thereby increases the gain to output 112. Similarly, the composite SOS detector is arranged such that for strong off and on-channel signals, the SOS detector function sources current, increases the amplitude of gain control signal 162, and increases attenuation by the AGC amplifier stage 104, thereby decreasing the gain to output 112. In the presence of large off-channel signals (e.g., greater than approximately −50 dBm), the AGC loop 100, with dual feedback and SOS detection, will operate to limit the peak signal swing at the input to the baseband LPF 110 to within a specified range (e.g., 0.35 to 0.88 Volts-peak (Vpeak)).

A feature of AGC loop 100 of this embodiment is its attack time or settling time. The attack time of an AGC loop is the period of time required for the loop to reach steady state operation in response to an arbitrary input power level. Attack times in the range between 4.0–6.0 millisecond are considered exceptionally short for conventional narrow band ZIF receivers. The attack time for AGC loop 100 is typically less than 1.5 milliseconds with LPF 110 bandwidth of 18 kilohertz (kHz) and AGC range in excess of 80 dB.

Figure 2:
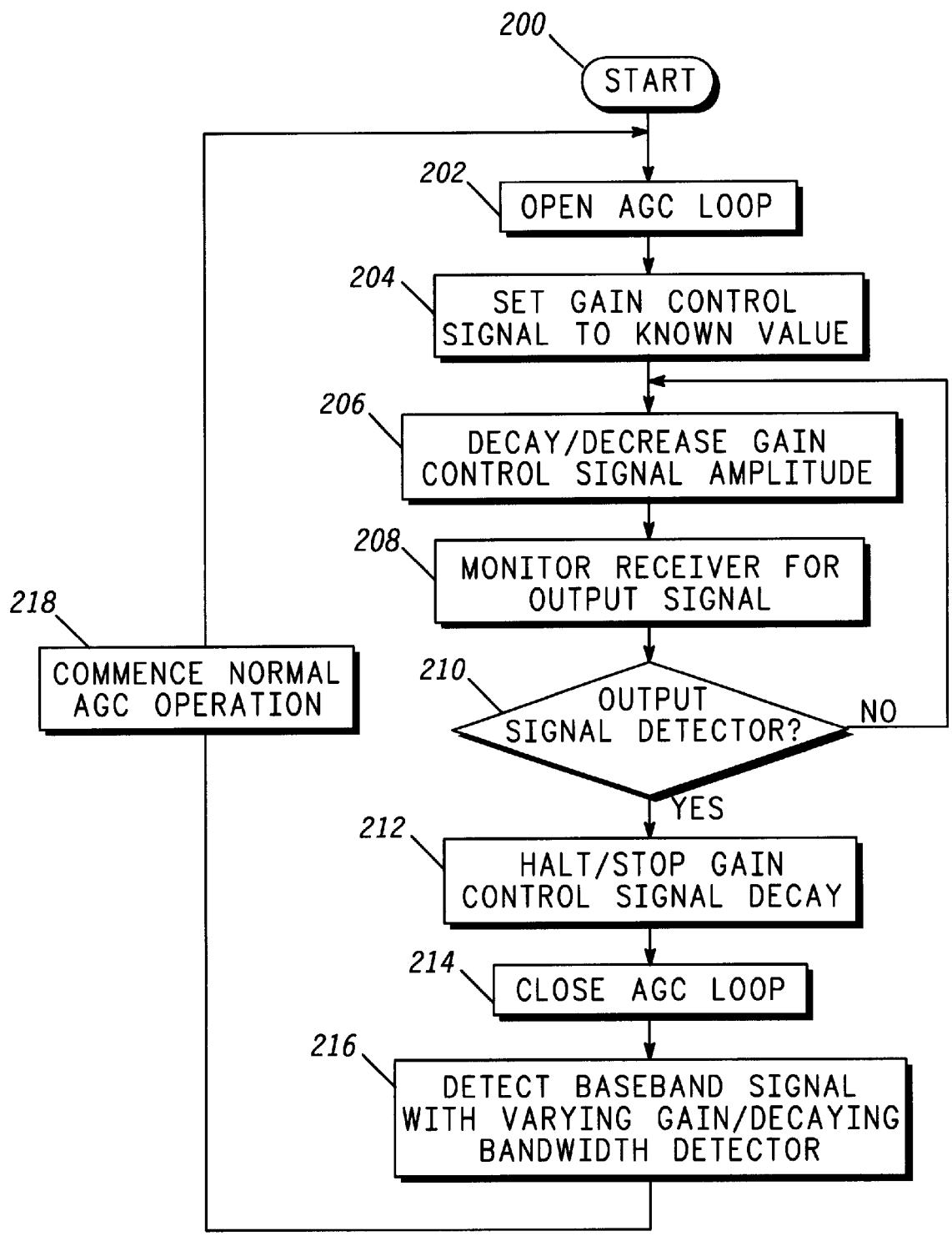
FIG. 2 is a flow chart diagram setting forth the steps for acquiring a rapid AGC response, in accordance with the present invention.

The methodology employed by AGC loop 100 in order to achieve this level of performance may be referred to as "reverse AGC." Reverse merely implies that higher levels of attenuation are utilized at the beginning of the training period and are then reduced until the desired level is attained. Referring to FIG. 2, there is presented a flow chart diagram setting forth the steps performed by AGC loop 100 of FIG. 1, while under the direction and control of AGC Controller 126, in order to acquire a rapid AGC response in accordance with the present invention.

Commencing at start block 200, flow proceeds to block 202 where the AGC loop 100 is placed in open loop operation. In accordance with the preferred embodiment, this is accomplished by Early Signal Detect Logic controller 168 opening switches S1–S4 via respective control lines 172, 176, 174, and 170. From block 202, flow proceeds to block 204 where the gain control signal 162 is set to a known value. Gain control signal 162 may be set by either AGC DAC 196 through switches S6–7 and unity gain buffer 187 or by Vpreset 186 through unity gain buffer 187 and switches S6–7. It can be seen that Early Signal Detect Logic 168 is provided with signals Off ESD 134 and On ESD 158 from comparators 132 and 156, respectively, which in turn are provided with signals 128 (at the output of Gesd amplifier gain stage 120), Voff_ref 130 and signals 152 (from the output of Gesd amplifier gain stage 144), Von_ref 154, respectively. Thereafter, as described above, a voltage of known amplitude is applied to gain control line 162 via a combination of Vpreset voltage source 186, switches S6–S7, and AGC DAC (digital-to-analog converter) 196. According to the present embodiment, the voltage provided by voltage source 186 corresponds to the maximum AGC attenuation available from AGC amplifier stage 104. While the present embodiment anticipates setting the gain of AGC amplifier 104 at maximum attenuation, it will be appreciated by those skilled in the art that other known levels of attenuation may be set by AGC DAC 196 and used as an initial setting without departing from the spirit and scope of the present invention.

Blocks 200–204 are hereinafter referred to collectively as AGC Preset. AGC Preset may be performed at any time prior to the initialization of the AGC attack. In accordance with the embodiments of the present invention AGC preset is typically performed at power-up or during battery saving operations. It is worth noting, however, that AGC Preset is not intrinsically dependent upon battery saving or power-up operations.

Upon initialization of AGC attack, flow proceeds from block 204 to block 206 where the amplitude of gain control signal 162 being applied to AGC amplifier 104 is rapidly decreased. In accordance with the present embodiment and with reference to FIG. 1, this is accomplished by first disconnecting switch S7. Thereafter, current sink 180 is applied to gain control line 162 via AGC Warp 106, switch S5, and control line sinken 178 under the control of Early Signal Detect Logic 168. As will be appreciated by those skilled in the art, the introduction of current sink 180 operates to rapidly pull charge off integrating capacitor 198, which in turn causes a corresponding decrease in the amplitude of gain control signal 162, resulting in a corresponding fall in AGC amplifier 104 attenuation and an inversely proportional rise in AGC amplifier 104 gain. In order to assure a faster than normal settling time, the rate at which the gain control signal amplitude is decreased must be a rate that is greater than the rate of the maximum stable closed loop response of the AGC loop.

At block 208, the input and output of LPF 110 is monitored by SOS detectors 114 and 143. The combination of SOS detector 114, Gesd amplifier gain stage 120, and comparator 132, and the combination of SOS detector 143, Gesd amplifier gain stage 144, and comparator 156 operate as step response detectors. If a signal that is greater than or equal to the corresponding AGC threshold is detected at block 210, flow proceeds to block 212. Otherwise, flow loops from block 210 back to block 206 where the amplitude of gain control signal 106 is further decreased.

Upon detection of a signal that is greater than or equal to the corresponding AGC threshold level, Early Signal Detect Logic Controller 168, at block 212, forces a halt to the decay of gain control signal 162 by switchably removing the current sink signal from integrating capacitor 198 and closes the AGC loop at block 214, thereby disabling the AGC Pull-Down phase of this embodiment of the present invention; namely, blocks 206–214 of FIG. 2.

Due to the required pull-down speed and the inherent delay associated with baseband signal processing, the pull-down mode tends to pull the gain control signal 162 voltage lower than the optimal settling point. Thus, when the AGC loop is closed at block 214 the AGC detector functions provided by SOS detector 114 in combination with Gdecay amplifier gain stage 124 and by SOS detector 143 in combination with Gdecay amplifier gain stage 148 must be able to quickly recover from an overshoot condition and bring the gain control signal 162 back to the desired settling point. Unfortunately, an AGC detector having a large enough gain to recover from pull-down overshoot tends to be susceptible to falsing if the output signal 112 is amplitude modulated. By falsing, it is meant that the detector may start to track the amplitude modulation in the signal and thereby distort the amplitude information as well as introduce excess ripple on the gain control signal 162. While a slower detector will produce less ripple, the recovery time from overshoot is typically too long. In accordance, an AGC detector that has a high initial gain that quickly decays over time is required. One embodiment of such a varying gain detector is disclosed in FIG. 3.

Thus, at block 216 Decay Generator 116 and Early Signal Detect Logic Controller 168 utilize varying gain/decaying bandwidth Gdecay amplifier gain stages 124 and 148, in conjunction with SOS detectors 114 and 143, respectively, to detect on-channel and off-channel baseband signals in order to recover from anticipated overshoot. Once the loop reaches steady state operation, and prior to the receipt of information signals, Early Signal Detect Logic Controller 168, via switch S2 and off decay control signal 176 for off-channel detection and switch S3 and on decay control signal 174 for on-channel detection, removes the AGC detector functions provided by Gdecay amplifier gain stages 124 and 148, respectively, from the AGC loop 100 and replaces them with a constant narrow bandwidth detectors provided by Gnorm amplifier gain stages 126 and 150. Since the response shapes for Gesd gain stages 120 and 144 are different form those exhibited by Gdecay gain stages 124 or 148 or for Gnormal gain stages 126 or 150, the feedback loops characterized by these detectors have switchably selectable response shapes to accommodate fast pull-down, overshoot recovery, and normal mode operations. It will be appreciated by those skilled in the art that the detector response shape is defined as the large signal input to output characteristic of the detector in question.

From block 216, flow proceeds to block 218, where normal AGC operation is commenced until the next AGC Preset is required. At such time, flow branches from block 218 back to block 202, where the above-described AGC operation repeats.

From the above description of the overall AGC system diagram 100, it can be seen that the narrow band ZIF receiver uses an AGC attack system that requires decaying gain detectors, which utilize decaying current sources, as indicated at block 216. The off-channel feedback path on the left side of the diagram uses two decaying current sources, Ioff_decay 140 and a decaying current source that resides in Gdecay amplifier gain stage 124, and the on-channel feedback path on the right side of the diagram similarly uses two decaying current sources, Ion_decay 166 and a decaying current source that resides in Ddecay amplifier gain stage 148; the decaying current sources that reside within the Gdecay amplifier gain stages 124, 148 will be described in more detail below. The current decay is used to control the gain of a detector, which in turn creates a desirable decaying AGC bandwidth characteristic. It is this decaying AGC bandwidth that enables quick AGC acquisition of a linear RF signal.

Figure 3:
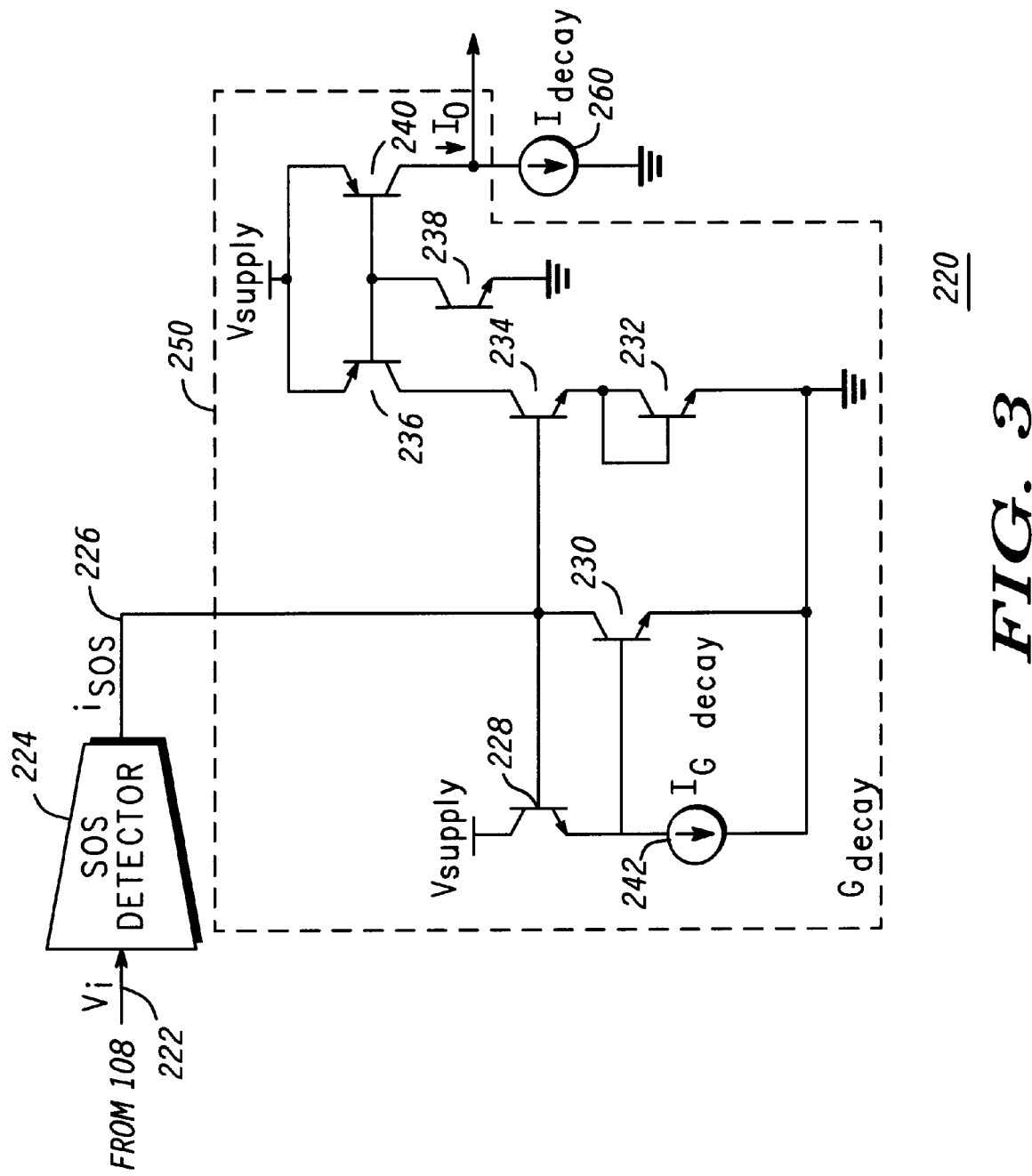
FIG. 3 is a detailed circuit diagram of the AGC detector functions of FIG. 1, in accordance with the present invention.

The AGC detector function provided by SOS detector 114, Gdecay amplifier gain stage 124, and Ioff_decay decaying current source 140 in the off-channel feedback path and the AGC detector function provided by SOS detector 143, Gdecay amplifier gain stage 148, and Ion_decay decaying current source 166 in the on-channel feedback path is reflected in FIG. 3. The detailed circuit diagram 220 of FIG. 3 illustrates the concept of an SOS detector 224 coupled to a Gdecay amplifier gain stage 250, which is turn is coupled to an Idecay decaying current source 260. This figure is applicable to both the off-channel and on-channel feedback paths. Thus, SOS detector is representative of SOS detector 114 in the off-channel path and of SOS detector 143 in the on-channel path. Gdecay 250 is representative of Gdecay 124 in the off-channel feedback path and of Gdecay 148 in the on-channel feedback path. Idecay decaying current source is representative of Ioff_decay decaying current source 140 in the off-channel feedback path and of Ion_decay decaying current source 166 in the on-channel feedback path.

It can be seen that Gdecay gain amplifier stage 250 has its own decaying current source $I_{Gdecay}$ 242 and seven transistors 228–240. The presence of decaying current source $I_{Gdecay}$ 242 in Gdecay 250 and Idecay decaying current source 260 means that each feedback path has two decaying current sources, for a total of four decaying current sources for the entire AGC system 100.

The varying gain or decaying bandwidth detectors reflected in FIG. 3 detect the baseband IF signal over a descending range of gain components moving from high to low until the settling point is reached. The detector transfer characteristic is given by the following equation:

$$i_{sos} = kv_i^2 \quad (1).$$

The small signal gain of the detector is given by:

$$gm_1 = \partial isos/\partial v_i \quad (2).$$

The output current of the composite detector is given by:

$$i_o = \sqrt{isos I_{Gdecay}}; i_o = \sqrt{kv_i^2 I_{Gdecay}} = v_i \sqrt{k I_{Gdecay}} \quad (3).$$

The composite small signal gain is given by:

$$gm_0 = \partial i_O/\partial v_i = \sqrt{k I_{Gdecay}} \quad (4).$$

Therefore, the gain and resulting AGC bandwidth are proportional to:

$$\sqrt{\sqrt{I_{Gdecay}}} \quad (5).$$

Based upon the foregoing, it will be appreciated by those having ordinary skill in the art, after review hereof, that detector gain and resulting AGC bandwidth depends upon the value of the decaying current $I_{Gdecay}$. By making the magnitude of $I_{Gdecay}$ decrease over time, the gain and bandwidth of the detector will decrease in an equally proportional amount over the same period of time. The rate of decrease is controlled by the slope of the decay function. In order to maintain a desired AGC threshold output reference current Idecay 260 will be decreased correspondingly.

If making $I_{Gdecay}$ decrease over time causes a proportional decrease in the gain of the detector and if the slope of the decay function determines the rate of the decrease, it will be appreciated by those skilled in the art that controlling the slope of the decay function for the decaying current $I_{Gdecay}$ permits additional control over the attack time of AGC loop 100 of FIG. 1. Accordingly, if the slope of the shaping function for current $I_{Gdecay}$ is made selectable or adjustable, then an AGC loop 100 having a selectable, adjustable, or dynamic AGC attack response is achievable.

Figure 4:
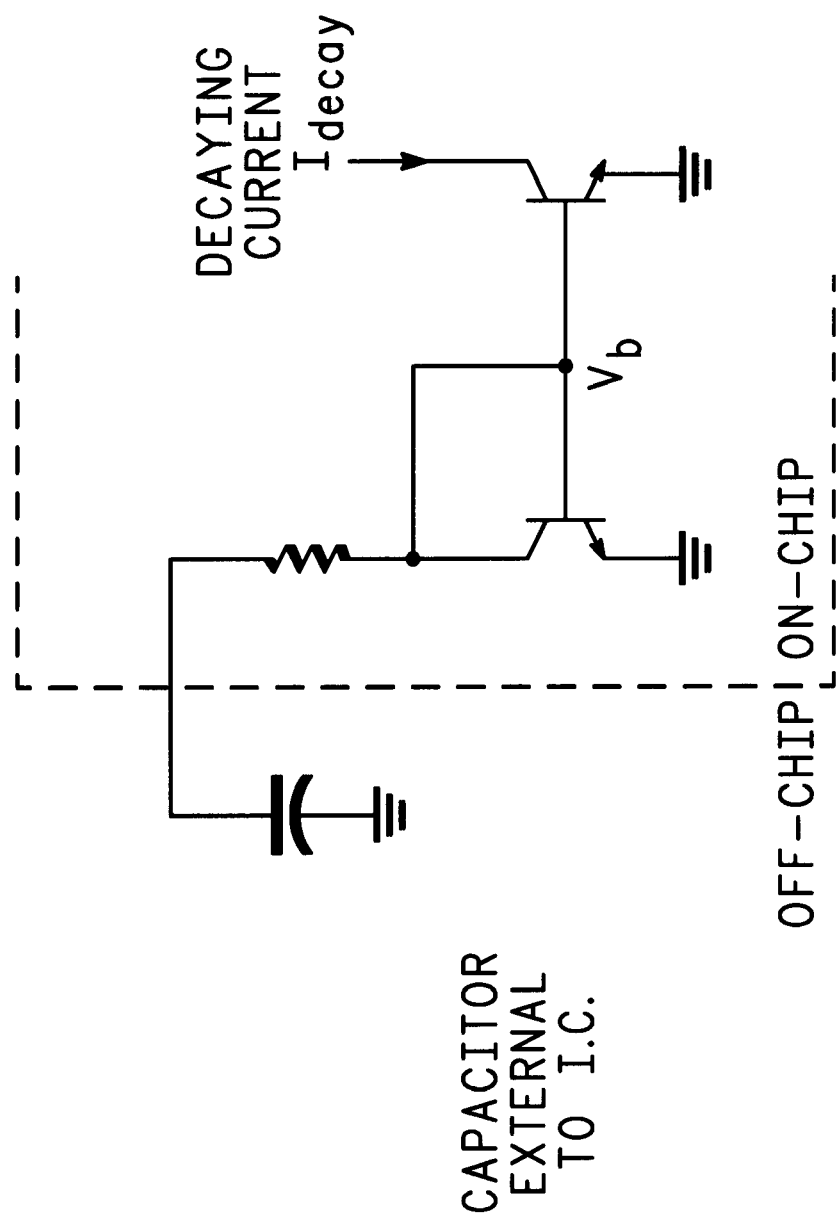
FIG. 4 is an example of a prior art decaying current shaping function.

An example of one shaping function for the decaying current $I_{Gdecay}$ is the exponential decay characterized by discharging a capacitor through a resistor, as shown in FIG. 4. It can be seen that the desired decaying current response in this figure is created by using an external capacitor in conjunction with an on-chip resistor to set a high RC time constant; by way of example, the capacitors may be on the order of 0.01 $\mu$F while the resistors may be 15 k$\Omega$. The prior art current shaping circuit of FIG. 4 is repeated four times for AGC system 100-one for each decaying current source contained within the figure. This means that there will be at least four RC networks with four capacitors that are all external to the chip on which the AGC system is implemented.

There arise several difficulties with using external capacitors to shape the decaying currents of AGC system 100. External capacitors are discrete components that take up a significant amount of space on the circuit board; the space required for four external capacitors, for instance, is significantly greater (on the order of 4x or more) than the size of the entire AGC system 100 inside an IC package. Their presence therefore prevents meaningful reduction in the size of the radio circuit board and thus in miniaturization of the narrow band radio itself. The capacitors additionally add to the cost of the radio circuit board and add to manufacturing complexity of the board by requiring soldering to place them on the board.

The present invention provides a significant improvement in the way in which the decaying current sources of AGC loop 100 are shaped with a quite different and superior approach. According to the preferred embodiment of the present invention, the desired decaying current response is obtained without using external capacitors. Instead, mirrors (mirror transistors) of a set or bank of on-chip weighted current mirrors are sequentially switched out with a time counter for each of the four decaying current sources. At the start of current decay, each current mirror of the bank of current mirrors is on and is attached to the output of the decaying current. Then, a clock is used to sequentially switch each current mirror out of the circuit, one after the other, to produce a reduction in current every so often, as determined by the frequency of the clock. The transistors of the current mirrors are weighted in size to produce the desired decay shape. Thus, more resolution (more steps) in the decay response is achieved by adding more current mirrors and a higher frequency clock to control switching out of the current mirrors in a sequential fashion. The ideal decay response can be adjusted by prudent selection of the current mirror weighting, the number of current mirrors, and the frequency of the control clock. Generally, a higher number of current mirrors with a correspondingly high frequency control clock will generate the best decaying current shaping response.

The use of banks of weighted current mirrors switched with a decayed step generator in the present invention to shape decaying currents, rather than using external capacitors in combination with resistances, is a vast improvement over the prior art approach. The transistors that make up the banks of weighted current mirrors and associated control circuitry take up very much less area that do the external capacitors. The transistors are on the IC of the radio receiver circuit board itself and their cost is negligible. All of these factors contribute towards the goal of miniaturization of narrow band IF receivers.

Figure 5:
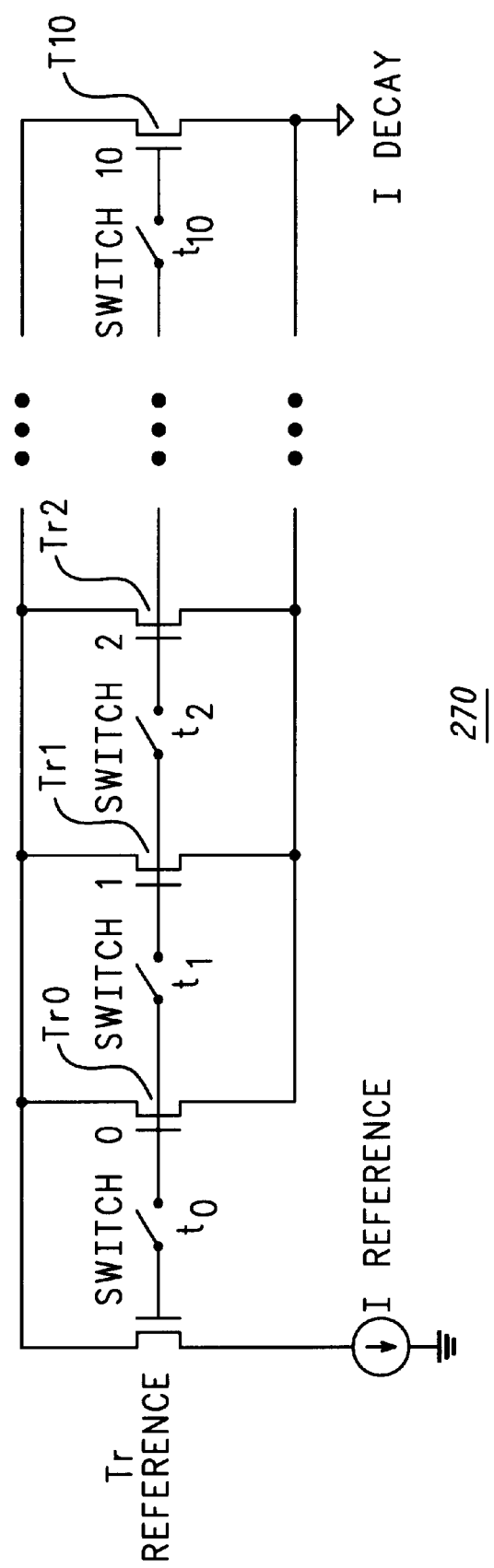
FIG. 5 is a simplified switching decay diagram, in accordance with the present invention.

FIG. 5 presents a simplified decay diagram that illustrates the sequential switching out of transistors of a bank of weighted current mirrors at predetermined time intervals t0, t1, t2, ..., t10, determined by the frequency of a control clock. Ireference is the reference current coupled to a reference transistor Tr that forms the reference leg of each of the current mirrors formed by subsequent mirror transistors Tr0, Tr1, Tr2, ..., Tr10, in the bank of current mirrors 270, as shown. Initially, all switches Switch1–Switch10 are closed and all 10 transistors t0, t1, t2, ..., t10 are thus in the circuit before Idecay has started to decay. In accordance with the timing of a control clock, each of the mirror transistors Tr0 through Tr10 are sequentially switched out of the circuit, one after the other, at times t0 ... t10 to generate Idecay. The shape of the decay of decaying current Idecay is controlled through appropriate selection of the weighting of each of the transistors Tr0 ... Tr10 in the bank of current mirrors 270.

Figure 6:
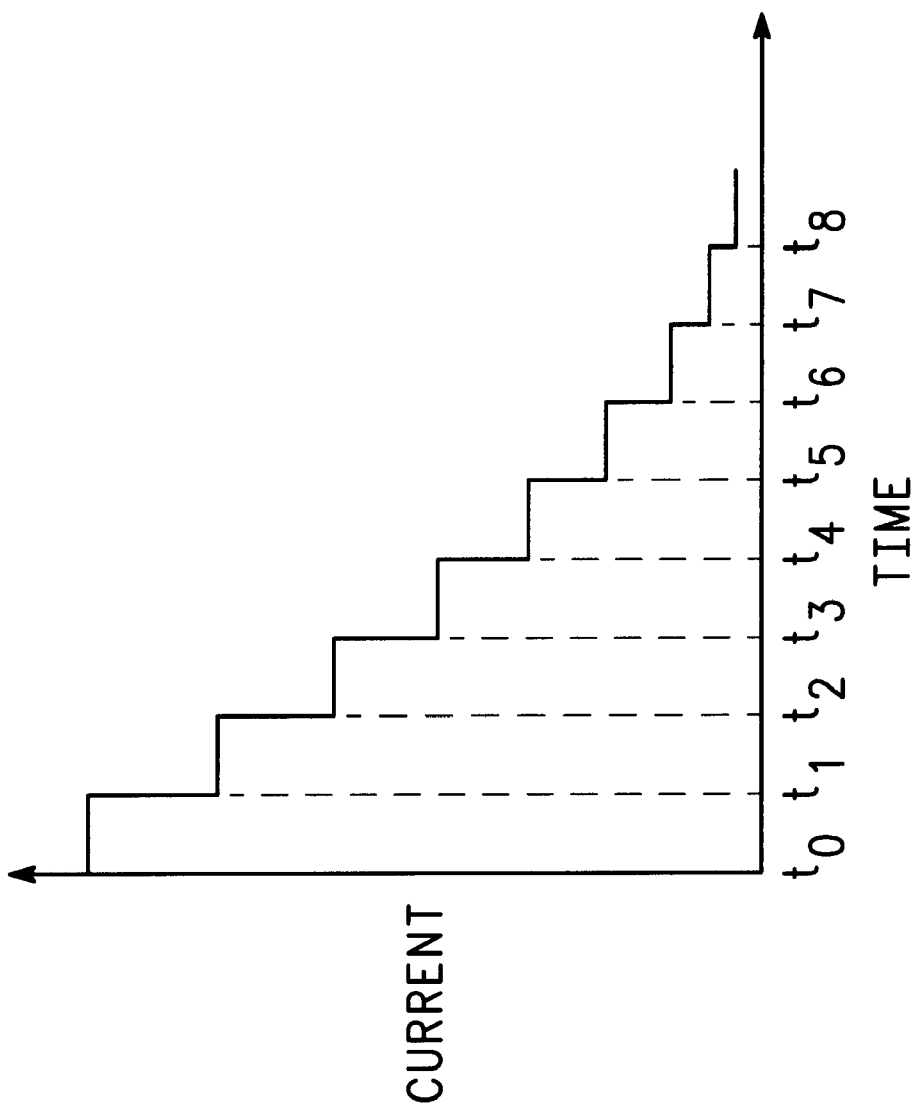
FIG. 6 illustrates the exponential decaying current shape that can be achieved, in accordance with the present invention.

Referring now to FIG. 6, the type of decay current shaping that can be obtained with the present invention is illustrated. Switching the current transistors sequentially out of the loop 100 at predetermined time intervals t1 . . . t10 causes the shape of the decaying current to decay in steps as shown. Due to the greater weighting of the mirror transistors in the first current mirrors, a larger drop of the current versus time is achieved for the first few time intervals that is gradually lessened by lessening the weighting of subsequent mirror transistors. The exponential shape illustrated in FIG. 6 is simply an exemplary decaying current shape. It is recognized that any desired shape of decay current may be achieved through the proper selection of current mirror weighting, number of current mirrors, and frequency of the control clock used for switching the mirror transistors out of the circuit.

Figure 7:
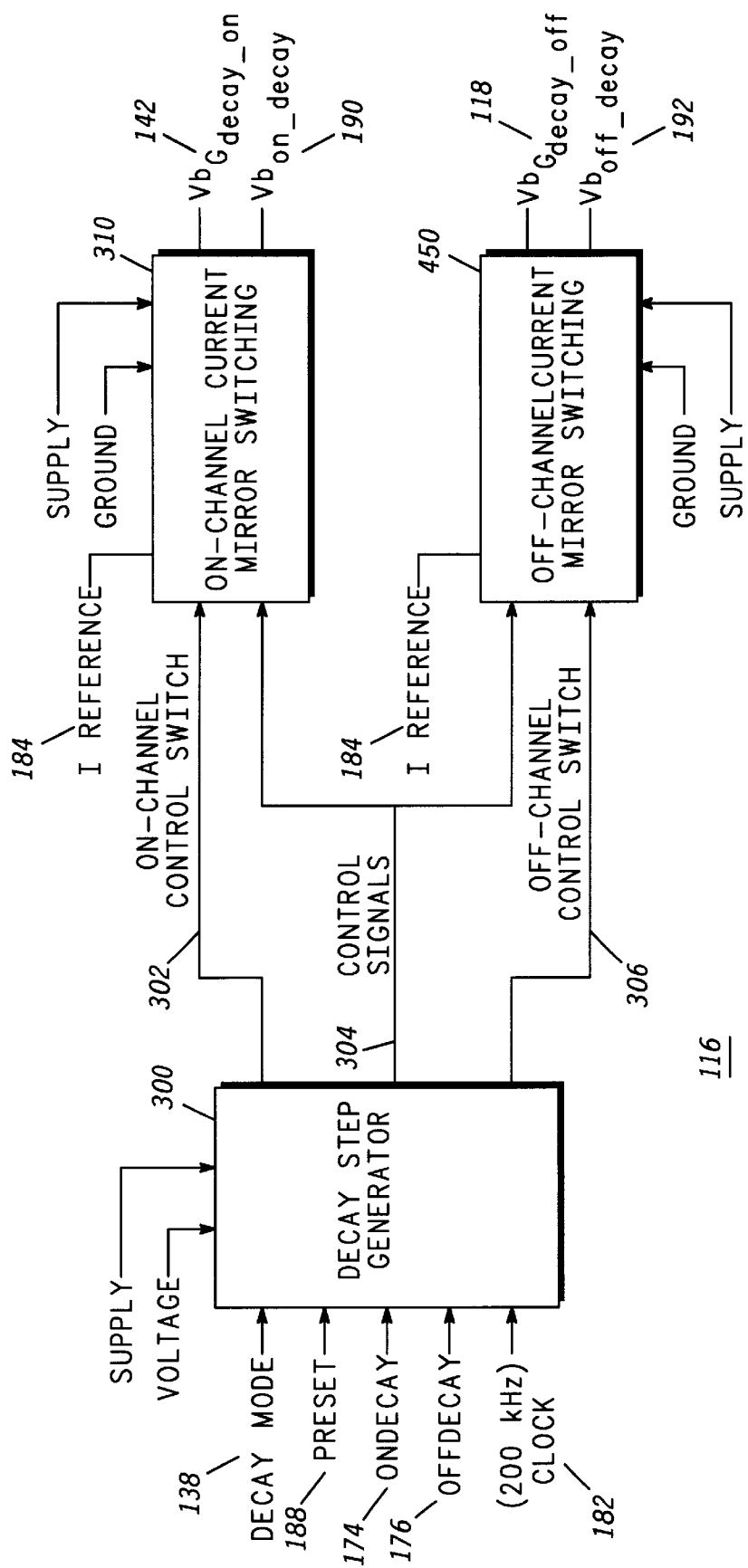
FIG. 7 is a block diagram of a decay generator, in accordance with the present invention.

Decay Generator block 116 of AGC system loop 100 contains the circuitry necessary to implement the unique decay current shaping of the present invention. Referring now to FIG. 7, an overall block diagram of Decay Generator 116 is shown. Decay Mode signal 138, Preset signal 188, Clock 182, On decay signal 174, and Offdecay signal 176 signals are provided to Decay Step Generator block 300 as shown; it is noted that Ondecay signal 174 and Offdecay signal 176 are provided by Early Signal Detect Logic block 168 of FIG. 1. Decay Mode signal 138 is a logic signal that indicates when decay of one of the four decaying current sources of loop 100 is to commence; a logic high level of Decay Mode signal 138 indicates that the loop is in the decay mode while a logic low level of Decay Mode signal 138 indicates that the loop is in normal operating mode. Preset signal 188 is part of the AGC algorithm and is used to initialize the AGC decay feature of loop 100 so that everything is in order when the Decay Mode signal 138 is high. This includes making certain that all mirror transistors (shown in FIGS. 9 and 10) of Decay Generator block 116 are in the circuit and not switched out of the circuit, as will be explained. Given these input signals, Decay Step Generator 300 generates Switching Control bus 304, on-channel control signal 302, and off-channel control signal 306.

The Switching Control signals of Switching Control bus 304 control the timing used for switching mirror transistors in and out within On-Channel Current Mirror Switching block 310 and Off-Channel Current Mirror Switching block 450; the number of Switching Control signals contained within Switching Control bus 304 may equal the number of weighted current mirrors contained within On-Channel and Off-Channel Current Mirror Switching blocks 310 and 450, although this is not required. On-Channel Control signal 302 and Off-Channel Control signal 306 work in tandem as a switch to indicate which of blocks 310 or 450 will are selected for control by the signals of Switching Control bus 304. The selected channel Current Mirror Switching block, either 310 or 450, operates in accordance with Switching Control bus 304 signals to generate the desired shape of Igdecay 250 and Idecay 260 decaying current sources for the selected channel. Thus if On-Channel Control signal 302 and Off-Channel Control signal 306 indicate that the on-channel feedback path of loop 100 is selected, then On-Channel Current Mirror Switching block 310 operates in accordance with the signals of Switching Control bus 304 to generate $Vb_{Gdecay\_on}$ 142 and $Vb_{on\_decay}$ 190. Conversely, if On-Channel Control signal 302 and Off-Channel Control signal 306 indicate that the off-channel feedback path of loop 100 is selected, then Off-Channel Current Mirror Switching block 450 operates in accordance with Switching Control signals 304 to generate $Vb_{Gdecay\_off}$ 118 and $Vb_{off\_decay}$ 192. Reference back to FIG. 1 shows that $Vb_{Gdecay\_on}$ 142 is used to control Gdecay amplifier gain stage 148 so that the shape of decaying current source Igdecay 250 within Gdecay 148 is in conformity with the bank of switching, weighted current mirrors contained within On-Channel Current Mirror Switching block 310. $Vb_{on\_decay}$ 190 is a voltage that is supplied to decaying current source Ion_decay 166 and is used to control the operation of this decaying current source. $Vb_{Gdecay\_off}$ 118 is used to control Gdecay amplifier gain stage 124 so that the shape of decaying current source Igdecay 250 within Gdecay 124 is in conformity with the bank of switching, weighted current mirrors contained within Off-Channel Current Mirror Switching block 450. $Vb_{off\_decay}$ 192 is a voltage that is supplied to decaying current source Ion_decay 140 and is used to control the operation of this decaying current source.

Figure 8:
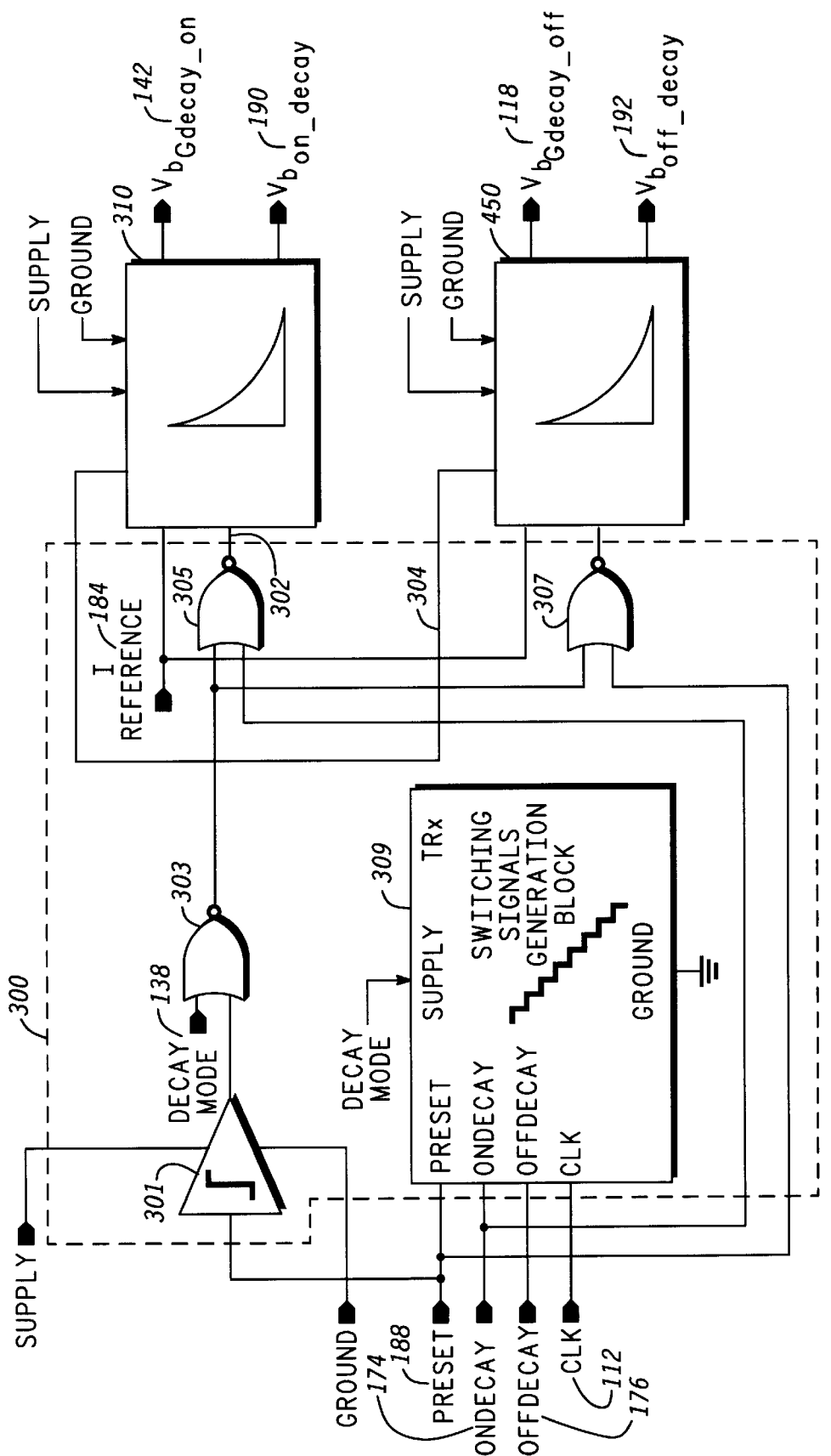
FIG. 8 illustrates a decay step generator block of a decay generator, in accordance with the present invention.

An example of a more specific implementation of Decay Step Generator block 300 of Decay Generator block 116 is illustrated in FIG. 8. In this example, Decay Step Generator block 300 employs several logic elements, including Schmitt trigger 301 and NOR logic gates 303, 305, and 307, to generate On-Channel Control signal 302 and Off-Channel Control signal 306, which operate effectively as a switch to choose between operation of On-Channel block 310 or Off-Channel block 450. Schmitt trigger 301 delays the falling edge of Preset signal 188 so that the rising edge of Decay Mode 138 will occur first. Switching Signals Generation block 309 may be implemented any number of ways and thus may vary from application to application, so long as the signals of Switching Control bus 304 are suitable for controlling the weighted current mirrors contained within On-Channel and Off-Channel Current Mirror Switching blocks 310 and 450.

Figure 9:
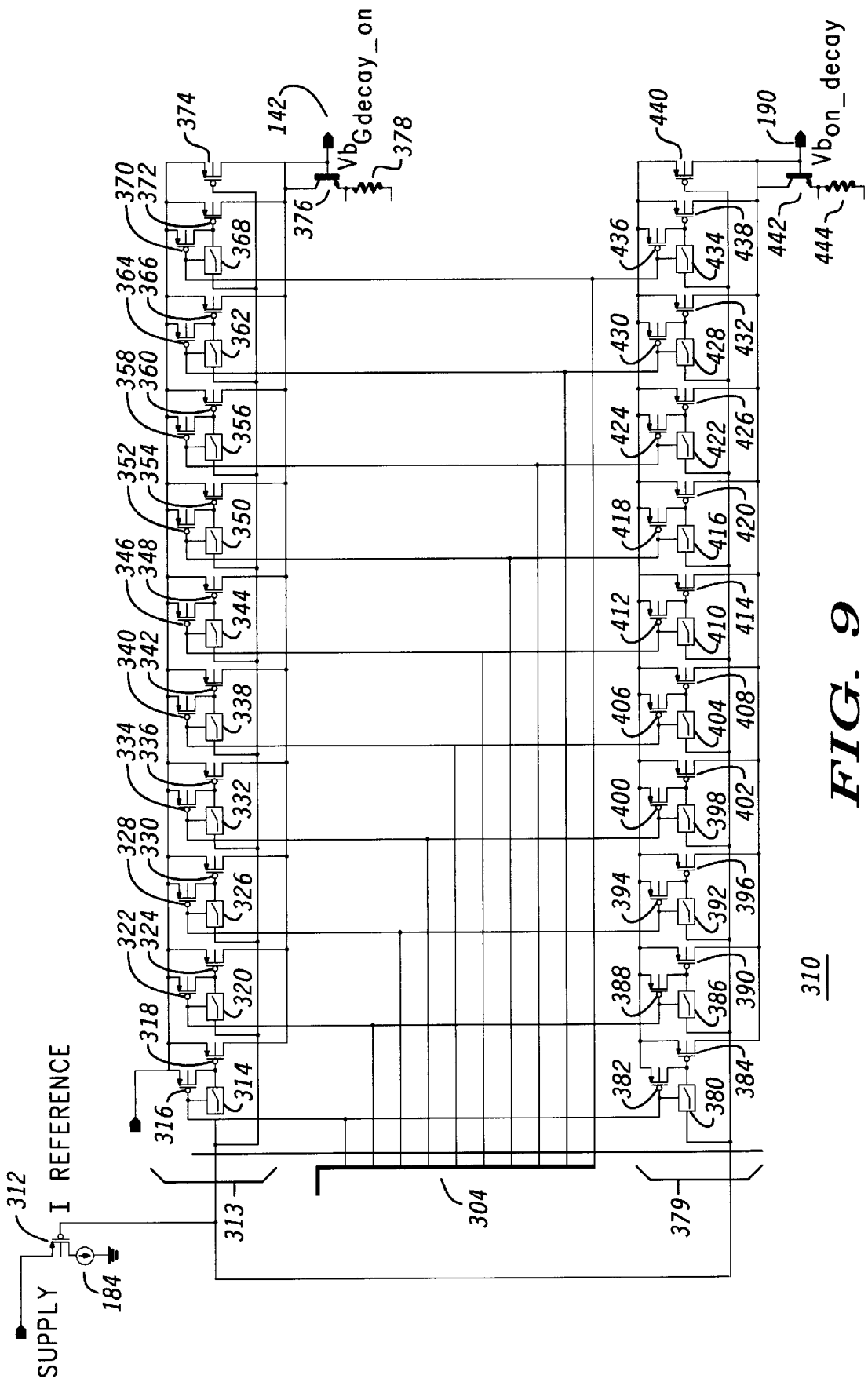
FIG. 9 illustrates two banks of weighted current mirrors of an On-Channel Current Mirror Switching block, in accordance with the present invention.
Figure 10:
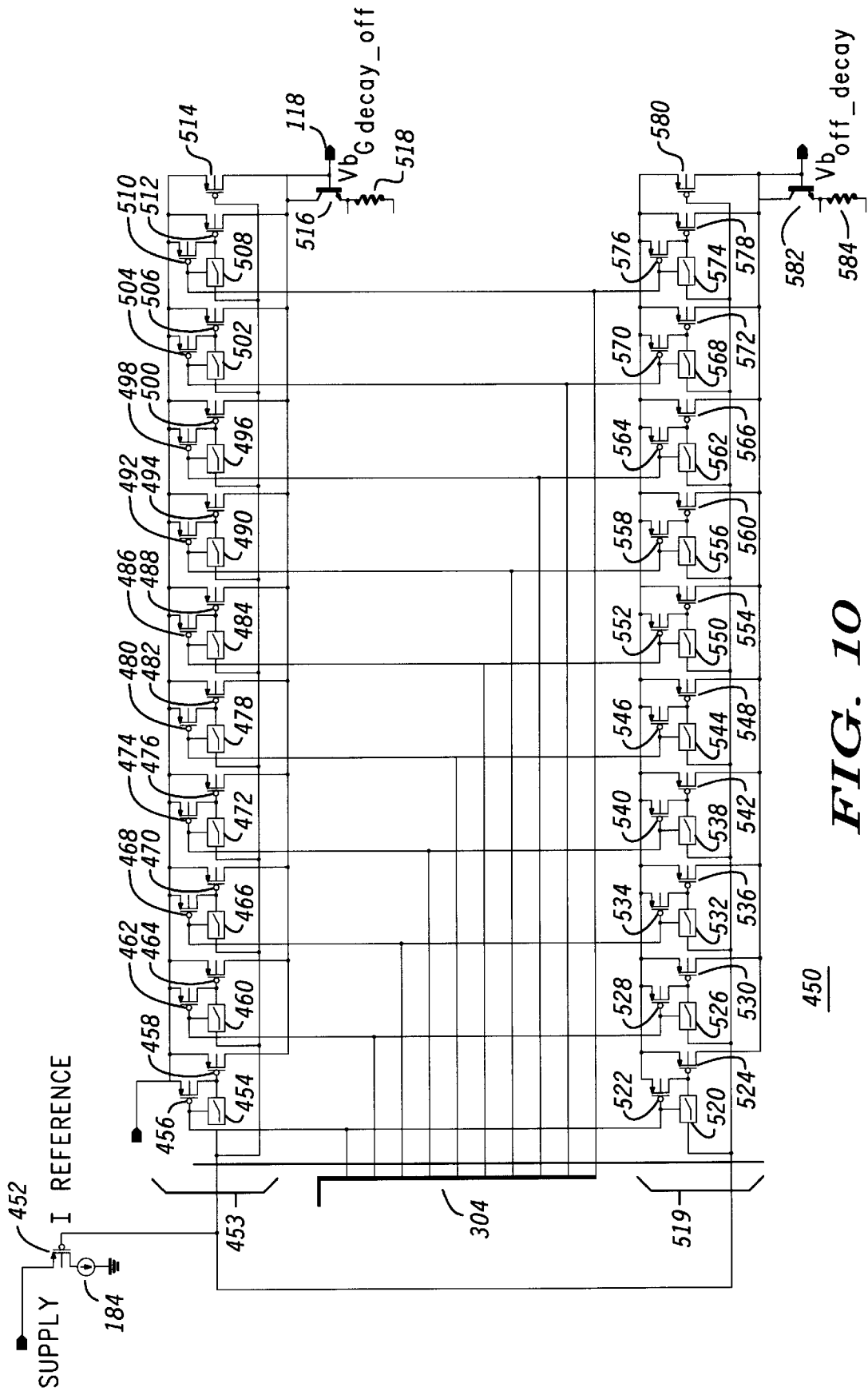
FIG. 10 illustrates two banks of weighted current mirrors of an Off-Channel Current Mirror Switching block, in accordance with the present invention.
Figure 11A:
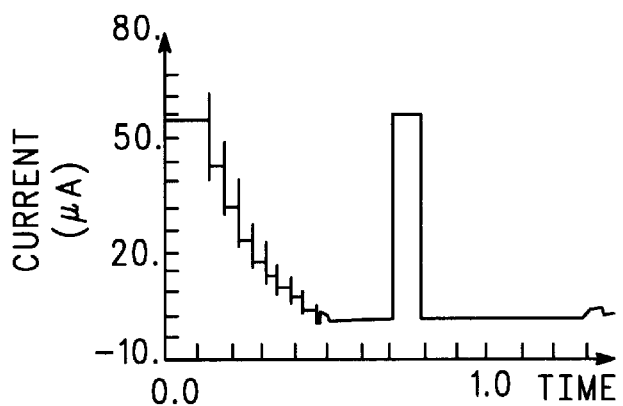
FIGS. 11A–11D illustrates the exponential decaying current shapes that can be achieved for decaying current sources of on-channel and off-channel feedback loops of an AGC loop, in accordance with the present invention.
Figure 11B:
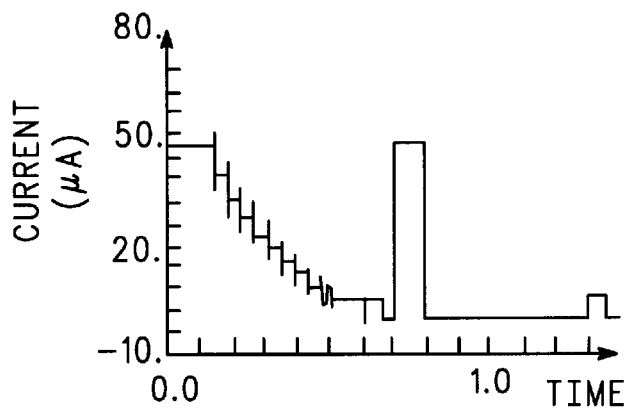
Figure 11C:
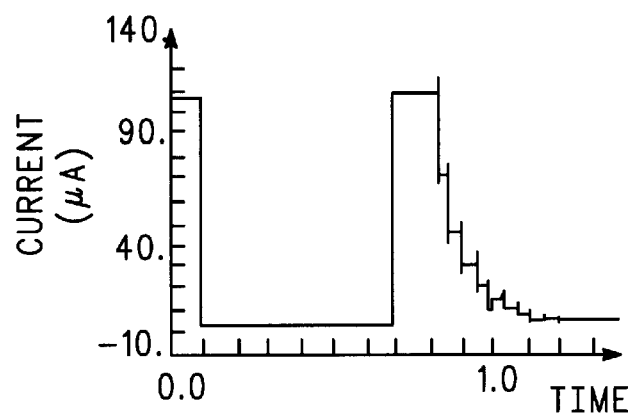
Figure 11D:
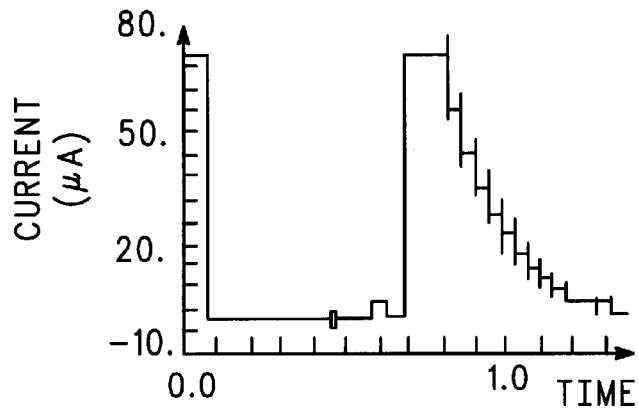

Illustration of a possible implementation of On-channel Mirror Switching block 310 and Off-channel Mirror Switching block 450 are shown in FIGS. 9 and 10. By way of example only, the following implementation utilizes four sets or banks of weighted current mirrors, one for each of the four decaying current sources to be found in AGC loop 100. In FIG. 9, two banks of weighted current mirrors of On-Channel Current Mirror Switching block 310 are shown, 313 and 379. Bank 313 operates with reference transistor 312, which is coupled to reference current Ireference, in accordance with Switching Control bus 304 to generate $Vb_{Gdecay\_on}$ 142. Bank 379 also operates with reference transistor 312 in accordance with Switching Control signals 304 to generate $Vb_{on\_decay}$ 190.

In the particular implementation of FIG. 9, each bank 313 and 379 contains 10 current mirrors for a total of 20 current mirrors in On-Channel Current Mirror Switching block 310. Reference transistor 312 forms the reference leg of each of the 20 current mirrors shown in FIG. 9; reference transistor 312 is itself coupled to reference current Ireference 184 as shown. The mirror leg of each current mirror is connected to the gate of reference transistor 312 and is formed by a switching portion and a weighted mirror transistor in each occurrence. The switching portion includes a switch and optionally a transistor that may be considered included in the switch if so desired; the switching portion is used to switch its associated weighted mirror transistor in and out of the bank. The ten switching portions of the ten mirror legs of Bank 313 are formed by switches 314 320, 326, 332, 338, 344, 350, 356, 362, 368 and corresponding transistors 316, 322, 328, 334, 340, 346, 352, 358, 364, 370; the weighted mirror transistors of Bank 313 include 318, 324, 330, 336, 342, 348, 354, 360, 366, and 372. The particular weighting assigned to each of the weighted mirror transistors, as well as the timing of switching, determines the unique shape of the Gdecay decaying current source of Gdecay amplifier gain stage 124 that will be produced. MOSFET 374 represents the current that is left when the switching mechanisms of the bank have switched out all the other mirror transistors (that is, MOSFET 374 preferably represents a minimum output current that is the smallest possible output current that can be generated by a bank 313, 379 of block 310). Bipolar transistor 376 and resistor 378 are used to reflect the current at MOSFET 374 to output voltage $Vb_{Gdecay\_on}$ 142. Thus, the first, and preferably the most heavily, weighted current mirror has reference transistor 312 in the reference leg and switch 314, transistor 316 and weighted mirror transistor 318 in the mirror leg of the current mirror. It can be seen that a control signal from Switching Control bus 304 is received by switch 314 and transistor 316 and is used to control when weighted mirror transistor 318 will be switched in and out of Bank 313.

Bank 379 operates in a similar manner. The reference leg of each of the ten weighted current mirrors of Bank 379 contains reference transistor 312 while the mirror leg of each current mirror of Bank 379 is formed by a switching portion and a weighted mirror transistor. As before, the switching portion of the mirror leg is utilized to switch the weighted mirror transistor in and out of Bank 379 at the appropriate time, as determined by a control signal of Switching Control bus 304. The ten switching portions of the ten mirror legs of Bank 379 are formed by switches 380, 386, 392, 398, 404, 410, 416, 422, 428, 434 and corresponding transistors 382, 388, 394, 400, 406, 412, 418, 424, 430, 436; the weighted mirror transistors of Bank 379 include 384, 390, 396, 402, 408, 414, 420, 426, 432, and 438. The particular weighting assigned to each of the weighted mirror transistors of Bank 379, as well as the timing of switching, determines the unique shape of Ion_decay decaying current source 166 that will be produced. MOSFET 440 represents the current that is left when the switching mechanisms of the bank have switched out all the other mirror transistors. Bipolar transistor 442 and resistor 444 are used to reflect the current at MOSFET 440 to output voltage $Vb_{on\_decay}$ 190. Thus, the last, and preferably the least heavily, weighted current mirror is made up of reference transistor 312 in the reference leg and switch 434, transistor 436, and weighted mirror transistor 438 in the mirror leg. It can be seen that a control signal from Switching Control bus 304 is received by switch 434 and transistor 436 and is used to control when weighted mirror transistor 438 will be switched in and out of Bank 379.

It is noted that corresponding mirror legs of Banks 313 and 379 are controlled by the same control signal of Switching Control bus 304. Thus, for example, the switching portion of the second current mirror of Bank 313, formed by switch 320 and transistor 322, is controlled by the same control signal of Switching Control bus 304 that controls the switching portion of the second current mirror of Bank 379, formed by switch 386 and transistor 388.

Banks 453 and 519 of Of-Channel Current Mirror Switching block 450 of FIG. 10 operate in a similar manner as Banks 313 and 379 of block 310. Reference transistor 452, coupled to Ireference current 184, forms the reference leg of each of the 20 current mirrors that make up block 450. The switching portions of the mirror legs of Bank 453 are made of switches 454, 460, 466, 472, 478, 484, 490, 496, 502, 508 and of transistors 456, 462, 468, 474, 480, 486, 492, 498, 504, 510, respectively. The weighted current mirrors that are controlled by these switching portions include, respectively, 458, 464, 470, 476, 482, 488, 494, 500, 506, and 512. MOSFET 514 represents the current that is left when the switching mechanisms of the bank have switched out all the other mirror transistors. Bipolar transistor 516 and resistor 518 are used to reflect the current at MOSFET 514 to output voltage $Vb_{Gdecay\_off}$ 118. The switching portions of the mirror legs of Bank 519 are made of switches 520, 526, 532, 538, 544, 550, 556, 562, 568, 574 and of transistors 522, 528, 534, 540, 546, 552, 558, 564, 570, 576, respectively. The weighted current mirrors that are controlled by these switching portions include, respectively, 524, 530, 536, 542, 548, 554, 560, 566, 572, 578. MOSFET 580 represents the current that is left when the switching mechanisms of the bank have switched out all the other mirror transistors. Bipolar transistor 582 and resistor 584 are used to reflect the current at MOSFET 580 to output voltage $Vb_{off\_decay}$ 192.

Prior to the start of decay of one or more of the decaying current sources, Preset signal 188 has initialized each of the banks of weighted current mirrors 313, 379, 453, and 519 so that each of the forty weighted mirror transistors in this example are connected in their respective banks. Thus at the start of current decay, as determined by Decay Mode signal 138, none of the weighted mirror transistors have been switched out of their bank by their associated switching portions. The control signals of Switching Control bus 304 sequentially cause each weighted mirror transistor of the two selected banks of the four banks of weighted current mirrors to switch out at predetermined times according to the control clock 182 provided to Decay Step Generator block 300. For example, suppose that On-Channel and Of-Channel control signals 302 and 306 have selected Off-Channel Current Mirror Switching Block; this indicates that $Vb_{Gdecay\_off}$ 118 and $Vb_{off\_decay}$ 192 will be simultaneously generated at 10 subsequent time intervals in order to control the shape of the decaying current source within Gdecay amplifier gain stage 124 and decaying current source Ioff_decay 140 of the off-channel feedback path of loop 100 in 10 discrete steps. $Vb_{Gdecay\_on}$ 142 and $Vb_{on\_decay}$ 190 will not be generated during this time since On-Channel and Off-Channel Control signals 302 and 306 have not selected On-Channel Current Mirror Switching block 310. As illustrated in FIGS. 11A–11D, $Vb_{Gdecay\_on}$ 142 and $Vb_{on\_decay}$ 190 are not generated while $Vb_{Gdecay\_off}$ 118 and $Vb_{off\_decay}$ 192 are being generated and vice-versa.

While the preferred embodiments of the invention have been illustrated and described, it will be clear that the invention is not so limited. Numerous modifications, changes, variations, substitutions and equivalents may be made by those skilled in the art without departing from the spirit and scope of the present invention as defined by the appended claims. For example, rather than reverse AGC, the opposite approach can be implemented where the AGC preset starts at a low/minimum attenuation, as opposed to the maximum attenuation start position suggested herein. Moreover, instead of a current sink 144 to provide a pull-down, a current source 180 may be equivalently utilized to alter the gain control signal amplitude and provide a pull-up function to adjust the gain control signal to its optional level. In accordance with this embodiment the receiver output will be monitored for the attenuation of the output signal. Upon detection of this output signal state, the pull-up function will be terminated. After overshoot recovery, normal mode operation will commence.

What is claimed is:

1. A fast attack Automatic Gain Control (AGC) loop having a forward transmission path with an amplifier stage responsive to receipt of a control signal that alters a gain of the amplifier stage and a low pass filter that receives an input and provides a filtered output, the AGC loop further comprising:

an off-channel feedback loop, that receives the input of the low pass filter and produces an output fed back to the amplifier stage, having an off-channel detector function and having a one or more off-channel decaying current sources that are capable of being selectably shaped during a decay mode of the AGC loop;

an on-channel feedback loop, that receives the filtered output of the low pass filter and applies the control signal to the amplifier stage, having an on-channel detector function and having one or more on-channel decaying current sources that are capable of being selectably shaped during the decay mode; and means within the AGC loop for sequentially and selectively switching out weighted transistors of a plurality of weighted current mirrors at predetermined intervals in order to selectably shape the one or more off-channel decaying current sources and the one or more on-channel decaying current sources during the decay mode.

2. The fast attack AGC loop of claim 1, wherein the means for sequentially and selectively switching out weighted transistors in order to selectably shape is a decay generator element comprising:

a decay step generator that generates a plurality of switching control signals;

a plurality of on-channel weighted current mirrors comprising:
a first bank of weighted current mirrors that generates a first control voltage that controls a shape of a first decaying current source of the on-channel feedback loop; and
a second bank of weighted current mirrors that generates a second control voltage that controls a shape of a second decaying current source of the on-channel feedback loop, with the first bank and second bank of weighted current mirrors controlled by the plurality of switching control signals when the plurality of on-channel weighted current mirrors is selected;
wherein the first and second bank of weighted current mirrors share a first reference leg; and
wherein the first bank of weighted current mirrors comprises a plurality of first bank mirror legs and the second bank of weighted current mirrors comprises a plurality of second bank mirror legs, with each first bank mirror leg of the plurality of first bank mirror legs and each second bank mirror leg of the plurality of second bank mirror legs comprising:
an on-channel switching element coupled to the first reference leg; and
a corresponding on-channel weighted transistor coupled to and controlled by the on-channel switching element, wherein the plurality of switching control signals controls the plurality of on-channel switching elements to selectively switch in or out the plurality of corresponding on-channel weighted transistors; and a plurality of off-channel weighted current mirrors comprising:
a third bank of weighted current mirrors that generates a third control voltage that controls a shape of a third decaying current source of the off-channel feedback loop; and
a fourth bank of weighted current mirrors that generates a fourth control voltage that controls a shape of a fourth decaying current source of the off-channel feedback loop, with the third bank and fourth bank of weighted current mirrors controlled by the plurality of switching control signals when the plurality of off-channel weighted current mirrors is selected;
wherein the third and fourth bank of weighted current mirrors share a second reference leg; and
wherein the third bank of weighted current mirrors comprises a plurality of third bank mirror legs and the fourth bank of weighted current mirrors comprises a plurality of fourth bank mirror legs, with each third bank mirror leg of the plurality of third bank mirror legs and each fourth bank mirror leg of the plurality of fourth bank mirror legs comprising:
an off-channel switching element coupled to the second reference leg; and
a corresponding off-channel weighted transistor coupled to and controlled by the off-channel switching element, wherein the plurality of switching control signals controls the plurality of off-channel switching elements to selectively switch in or out the plurality of corresponding off-channel weighted transistors.

3. The fast attack AGC loop of claim 2, wherein the first reference leg comprises a first reference transistor coupled to the reference current and the second reference leg comprises a second reference transistor coupled to the reference current.

4. The fast attack AGC loop of claim 1, wherein the means for sequentially and selectively switching out weighted transistors in order to selectably shape is a decay generator element comprising:

a decay step generator that generates a plurality of switching control signals;

a plurality of on-channel weighted current mirrors comprising:
a first bank of weighted current mirrors that generates a first control voltage that controls a shape of a first decaying current source of the on-channel feedback loop, with the first bank of weighted current mirrors controlled by the plurality of switching control signals when the plurality of on-channel weighted current mirrors is selected;
wherein the first bank of weighted current mirrors comprises a plurality of first bank mirror legs, with each first bank mirror leg of the plurality of first bank mirror legs comprising:
an on-channel switching element coupled to a first reference leg of the first bank; and
a corresponding on-channel weighted transistor coupled to and controlled by the on-channel switching element, wherein the plurality of switching control signals controls the plurality of on-channel switching elements to selectively switch in or out the plurality of corresponding on-channel weighted transistors; and a plurality of off-channel weighted current mirrors comprising:
a second bank of weighted current mirrors that generates a second control voltage that controls a shape of a second decaying current source of the off-channel feedback loop, with the second bank of weighted current mirrors controlled by the plurality of switching control signals when the plurality of off-channel weighted current mirrors is selected;
wherein the second bank of weighted current mirrors comprises a plurality of second bank mirror legs, with each second bank mirror leg of the plurality of second bank mirror legs comprising:

an off-channel switching element coupled to a second reference leg of the second bank; and a corresponding off-channel weighted transistor coupled to and controlled by the off-channel switching element, wherein the plurality of switching control signals controls the plurality of off-channel switching elements to selectively switch in or out the plurality of corresponding off-channel weighted transistors.

5. A fast attack Automatic Gain Control (AGC) loop having a forward transmission path with an amplifier stage responsive to receipt of a control signal that alters a gain of the amplifier stage and a low pass filter that receives an input and provides a filtered output, the AGC loop further comprising:

a control signal generator, coupled to the amplifier stage, for providing the control signal;

a preset circuit, coupled to the control signal generator, that generates a preset signal for setting the control signal amplitude to a known value;

a current device, coupled to the control signal generator, for altering the amplitude of the control signal;

an off-channel feedback loop, at the input of the low pass filter that receives the input of the low pass filter and produces an output fed back to the amplifier stage, having an off-channel detector function and having a one or more off-channel decaying current sources that are capable of being selectably shaped during a decay mode of the AGC loop, comprising:

a first off-channel detector that partially controls shaping of the one or more off-channel decaying current sources during the decay mode;

a second off-channel detector that controls the amplitude of off-channel signals in the forward transmission path during a normal mode of operation of the AGC loop;

a third off-channel detector, coupled to the first off-channel detector, that detects a state of the input provided to the low pass filter in the forward transmission path;

an on-channel feedback loop, at the output of the low pass filter that receives the filtered output of the low pass filter and applies the control signal to the amplifier stage, having an on-channel detector function and having one or more on-channel decaying current sources that are capable of being selectably shaped during the decay mode, comprising:

a first on-channel detector that partially controls shaping of the one or more on-channel decaying current sources during the decay mode;

a second on-channel detector that controls the amplitude of on-channel signals in the forward transmission path during the normal mode of operation of the AGC loop;

a third on-channel detector, coupled to the first on-channel detector, that detects a state of the filtered output in the forward transmission path;

an early signal detect logic controller, coupled to the third off-channel detector and the third on-channel detector, that generates an off-channel normal mode control signal that controls coupling of the second off-channel detector to the control signal generator, an on-channel normal mode control signal that controls coupling of the second on-channel detector to the control signal generator, an off-channel decay mode control signal that controls coupling of the first off-channel detector to the control signal generator, and an on-channel decay mode control signal that controls coupling of the first on-channel detector to the control signal generator; and a decay generator element, responsive to receiving a reference current, the off-channel decay mode control signal, the on-channel decay mode control signal, a decay mode signal indicative of whether the AGC loop is in the decay mode, a control clock, and the preset signal that initializes the decay generator element, that sequentially and selectively switches out weighted transistors of a plurality of weighted current mirrors at predetermined intervals in accordance with the control clock in order to generate an off-channel decay control signal capable of selectably shaping the one or more off-channel decaying current sources during the decay mode and to generate an on-channel decay control signal capable of selectably shaping the one or more on-channel decaying current sources during the decay mode.

6. The fast attack AGC loop of claim 5, wherein the control signal generator comprises in part an integrating capacitor.

7. The fast attack AGC loop of claim 5, wherein the control signal generator comprises an integrating capacitor and an AGC warp element.

8. The fast attack AGC loop of claim 5, wherein the first off-channel detector comprises:

a first detector element; and a first off-channel amplifier gain stage coupled to the first detector element.

9. The fast attack AGC loop of claim 8, wherein the first detector element is a first sum-of-squares (SOS) detector.

10. The fast attack AGC loop of claim 5, wherein the second off-channel detector comprises a second off-channel amplifier gain stage coupled to the first detector element.

11. The fast attack AGC loop of claim 5, wherein the third off-channel detector comprises a third off-channel amplifier gain stage coupled to the first detector element.

12. The fast attack AGC loop of claim 5, wherein the first on-channel detector comprises:

a second detector element; and a first on-channel amplifier gain stage coupled to the second detector element.

13. The fast attack AGC loop of claim 12, wherein the second detector element is a second SOS detector.

14. The fast attack AGC loop of claim 5, wherein the second on-channel detector comprises a second on-channel amplifier gain stage coupled to the second detector element.

15. The fast attack AGC loop of claim 5, wherein the third on-channel detector comprises a third on-channel amplifier gain stage coupled to the second detector element.

16. The fast attack AGC loop of claim 5, wherein the decay generator element comprises:

a decay step generator that generates a plurality of switching control signals;

a plurality of on-channel weighted current mirrors comprising:

a first bank of weighted current mirrors that generates a first control voltage that controls a shape of a first decaying current source of the on-channel feedback loop; and a second bank of weighted current mirrors that generates a second control voltage that controls a shape of a second decaying current source of the on-channel feedback loop, with the first bank and second bank of weighted current mirrors controlled by the plurality of switching control signals when the plurality of on-channel weighted current mirrors is selected;

wherein the first and second bank of weighted current mirrors share a first reference leg; and wherein the first bank of weighted current mirrors comprises a plurality of first bank mirror legs and the second bank of weighted current mirrors comprises a plurality of second bank mirror legs, with each first bank mirror leg of the plurality of first bank mirror legs and each second bank mirror leg of the plurality of second bank mirror legs comprising:

an on-channel switching element coupled to the first reference leg; and a corresponding on-channel weighted transistor coupled to and controlled by the on-channel switching element, wherein the plurality of switching control signals controls the plurality of on-channel switching elements to selectively switch in or out the plurality of corresponding on-channel weighted transistors a plurality of off-channel weighted current mirrors comprising:

a third bank of weighted current mirrors that generates a third control voltage that controls a shape of a third decaying current source of the off-channel feedback loop; and a fourth bank of weighted current mirrors that generates a fourth control voltage that controls a shape of a fourth decaying current source of the off-channel feedback loop, with the third bank and fourth bank of weighted current mirrors controlled by the plurality of switching control signals when the plurality of off-channel weighted current mirrors is selected;

wherein the third and fourth bank of weighted current mirrors share a second reference leg; and wherein the third bank of weighted current mirrors comprises a plurality of third bank mirror legs and the fourth bank of weighted current mirrors comprises a plurality of fourth bank mirror legs, with each third bank mirror leg of the plurality of third bank mirror legs and each fourth bank mirror leg of the plurality of fourth bank mirror legs comprising:

an off-channel switching element coupled to the second reference leg; and a corresponding off-channel weighted transistor coupled to and controlled by the off-channel switching element, wherein the plurality of switching control signals controls the plurality of off-channel switching elements to selectively switch in or out the plurality of corresponding off-channel weighted transistors.

17. The fast attack AGC loop of claim 16, wherein the first reference leg comprises a first reference transistor coupled to the reference current.

18. The fast attack AGC loop of claim 16, wherein the second reference leg comprises a second reference transistor coupled to the reference current.

19. A fast attack Automatic Gain Control (AGC) loop having a forward transmission path with an amplifier stage responsive to receipt of a control signal that alters a gain of the amplifier stage and a low pass filter that receives an input and provides a filtered output, the AGC loop further comprising:

a feedback loop, that receives an output signal of the amplifier stage, having a detector function and having a one or more decaying current sources that are capable of being selectably shaped during a decay mode of the AGC loop; and means within the AGC loop for sequentially and selectively switching out weighted transistors of a plurality of weighted current mirrors at predetermined intervals in order to selectably shape the one or more decaying current sources during the decay mode.

20. The fast attack AGC loop of claim 19, wherein the sequential and selective switching of the weighted transistors of the plurality of weighted current mirrors operates to speed up operation of the feedback loop.

21. The fast attack AGC loop of claim 19, wherein the feedback loop is an off-channel feedback loop and the one or more decaying current sources are one or more off-channel decaying current sources.

22. The fast attack AGC loop of claim 19, wherein the feedback loop is an on-channel feedback loop and the one or more decaying current sources are one or more on-channel decaying current sources.

* * * * *